US 12,489,082 B2
Dec. 2, 2025

(12) United States Patent
Liang et al.

(10) Patent No.: US 12,489,082 B2
(45) Date of Patent: Dec. 2, 2025

(54) METAL NANOPARTICLES IN AN AMORPHOUS BONDING LAYER BETWEEN A DEVICE SUBSTRATE AND CARRIER SUBSTRATE

(71) Applicant: TAIWAN SEMICONDUCTOR MANUFACTURING COMPANY, LTD., Hsinchu (TW)

(72) Inventors: Zheng-Yong Liang, Hsinchu (TW); Yu-Yun Peng, Hsinchu (TW); Keng-Chu Lin, Hsinchu (TW); Wei-Ting Yeh, Hsinchu (TW); Chia-Yun Cheng, Hsinchu (TW); Chen-Hao Wu, Hsinchu (TW); Yu-Wei Lu, Hsinchu (TW); Han-De Chen, Hsinchu (TW); Hsu-Kai Chang, Hsinchu (TW); Kuei-Lin Chan, Hsinchu (TW); Kenichi Sano, Hsinchu (TW); Huang-Lin Chao, Hsinchu (TW); Cheng-I Chu, Hsinchu (TW); Yi-Rui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 24 days.

(21) Appl. No.: 18/404,631

(22) Filed: Jan. 4, 2024

(65) Prior Publication Data
US 2025/0226359 A1 Jul. 10, 2025

(51) Int. Cl.
*H01L 21/02* (2006.01)
*H01L 23/00* (2006.01)
*H01L 25/065* (2023.01)

(52) U.S. Cl.
CPC ........ *H01L 24/83* (2013.01); *H01L 21/02107* (2013.01); *H01L 24/27* (2013.01);
(Continued)

(58) Field of Classification Search
CPC ........ H01L 24/83; H01L 24/27; H01L 24/29; H01L 24/32; H01L 25/0657; H01L 21/02107
See application file for complete search history.

(56) References Cited

U.S. PATENT DOCUMENTS 6,294,478 B1 * 9/2001 Sakaguchi ........ H01L 21/76259
148/33.5
2013/0328174 A1 * 12/2013 La Tulipe, Jr. ......... H01L 25/50
257/629

(Continued)

FOREIGN PATENT DOCUMENTS

WO WO-2022040052 A1 * 2/2022 ......... C23C 16/4585

*Primary Examiner* — Alonzo Chambliss
(74) *Attorney, Agent, or Firm* — Birch, Stewart, Kolasch & Birch, LLP

(57) ABSTRACT

A method for manufacturing a semiconductor structure includes: forming a first bonding layer on a device substrate, the first bonding layer including a first bonding sub-layer and a second bonding sub-layer, the first bonding sub-layer including a first metal oxide material in an amorphous state and a plurality of metal nanoparticles, the second bonding sub-layer including a second metal oxide material in an amorphous state; forming a second bonding layer on a carrier substrate, the second bonding layer including a third metal oxide material in an amorphous state; conducting a surface modification process on the first and second bonding layers; bonding the device and carrier substrates to each other through the first and second bonding layers; and annealing the first and second bonding layers to convert the first, second, and third metal oxide materials from the amorphous state to a crystalline state.

20 Claims, 13 Drawing Sheets

(52) U.S. Cl.
CPC ............. *H01L 24/29* (2013.01); *H01L 24/32* (2013.01); *H01L 25/0657* (2013.01); *H01L 2224/2745* (2013.01); *H01L 2224/27452* (2013.01); *H01L 2224/27845* (2013.01); *H01L 2224/29082* (2013.01); *H01L 2224/29083* (2013.01); *H01L 2224/29139* (2013.01); *H01L 2224/29144* (2013.01); *H01L 2224/29176* (2013.01); *H01L 2224/29188* (2013.01); *H01L 2224/29288* (2013.01); *H01L 2224/29339* (2013.01); *H01L 2224/29344* (2013.01); *H01L 2224/29376* (2013.01); *H01L 2224/32225* (2013.01); *H01L 2224/32505* (2013.01); *H01L 2224/83009* (2013.01); *H01L 2224/83193* (2013.01); *H01L 2224/83201* (2013.01); *H01L 2224/83896* (2013.01); *H01L 2224/83948* (2013.01); *H01L 2924/0532* (2013.01); *H01L 2924/05341* (2013.01); *H01L 2924/054* (2013.01); *H01L 2924/0542* (2013.01); *H01L 2924/0543* (2013.01)

(56) References Cited

U.S. PATENT DOCUMENTS

2024/0030180 A1\* 1/2024 Liang ...................... H01L 24/83
2024/0355733 A1\* 10/2024 Liang .................. H01L 25/0657

\* cited by examiner

METAL NANOPARTICLES IN AN AMORPHOUS BONDING LAYER BETWEEN A DEVICE SUBSTRATE AND CARRIER SUBSTRATE

BACKGROUND

The semiconductor integrated circuit (IC) industry has, over the decades, experienced tremendous advancements and is still undergoing vigorous development. With dramatic advances in technology, the industry pays much attention on the development of small IC devices with high performance and low power consumption. Since substrate is an important component of semiconductor devices, substrate bonding issue, such as heat dissipation issue, needs be solved in order to facilitate manufacturing process of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
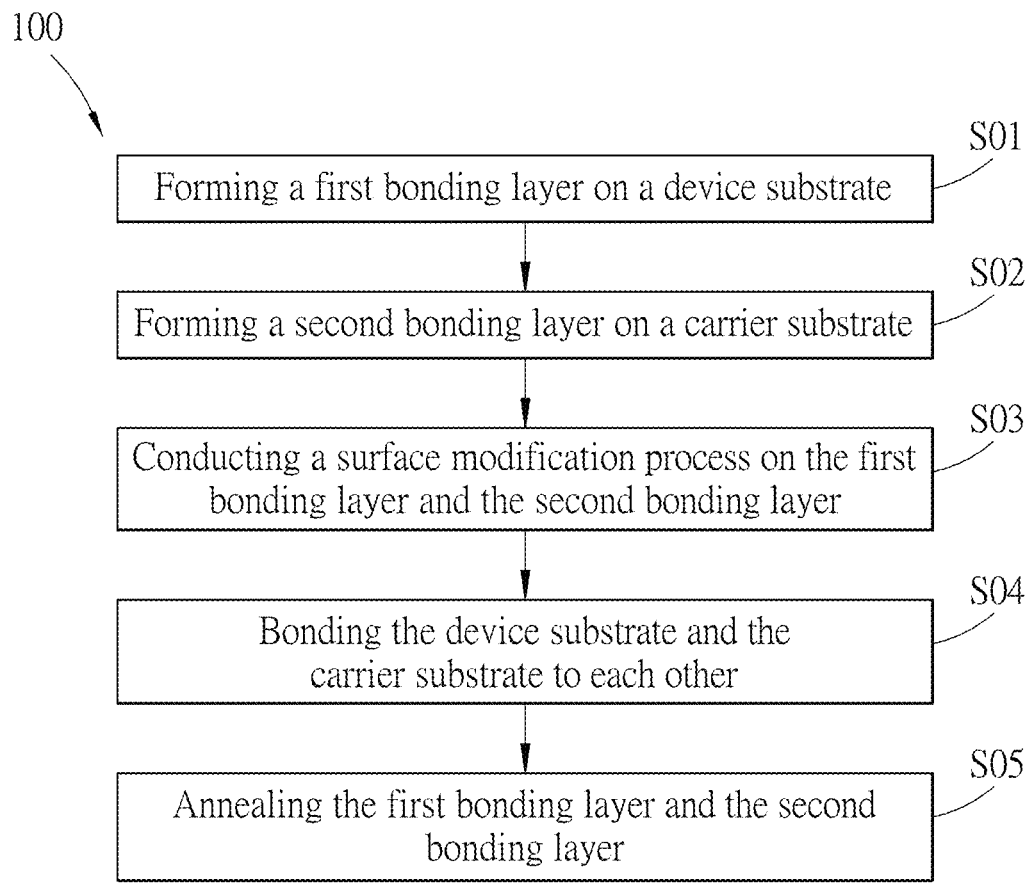
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," "uppermost," "horizontal," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a substrate bonding method and a semiconductor structure manufactured using the substrate bonding method. In the substrate bonding method (for example, fusion bonding), the semiconductor structure includes two substrates being bonded to each other through two metal oxide-based bonding layers which are respectively formed on the two substrates and which have high thermal conductivity. The present disclosure provides an exemplary method to manufacture, for example, but not limited to, a semiconductor structure which includes a device substrate, a semiconductor device formed on the device substrate, and a blank substrate that serves as a carrier substrate and that is bonded to the device substrate through a first metal oxide-based bonding layer formed on the device substrate and a second metal oxide-based bonding layer formed on the blank substrate, in which at least one of the first metal oxide-based bonding layer and the second metal oxide-based bonding layer includes a metal oxide-based composite, which includes a metal oxide material and metal nanoparticles. The semiconductor structure may be further utilized in any appropriate applications, for example, but not limited to, backside illumination complementary metal-oxide-semiconductor image sensor, digital signal processors, memory devices, analog processors, radio frequency (RF) circuits, resistors, inductors, and capacitors. Other suitable applications are within the contemplated scope of the disclosure. FIG. 1 is a flow diagram illustrating an exemplary method 100 for manufacturing an exemplary semiconductor structure 200 as shown in FIG. 17, FIG. 18, FIG. 20, or FIG. 21 in accordance with some embodiments. FIGS. 2 to 21 are schematic views of some intermediate stages of the manufacturing method as depicted in FIG. 1 in accordance with some embodiments. Some portions are omitted in FIGS. 2 to 21 for the sake of brevity. Additional steps can be provided before, after or during the method 100, and some of the steps described herein may be replaced by other steps or be eliminated.

Figure 2:
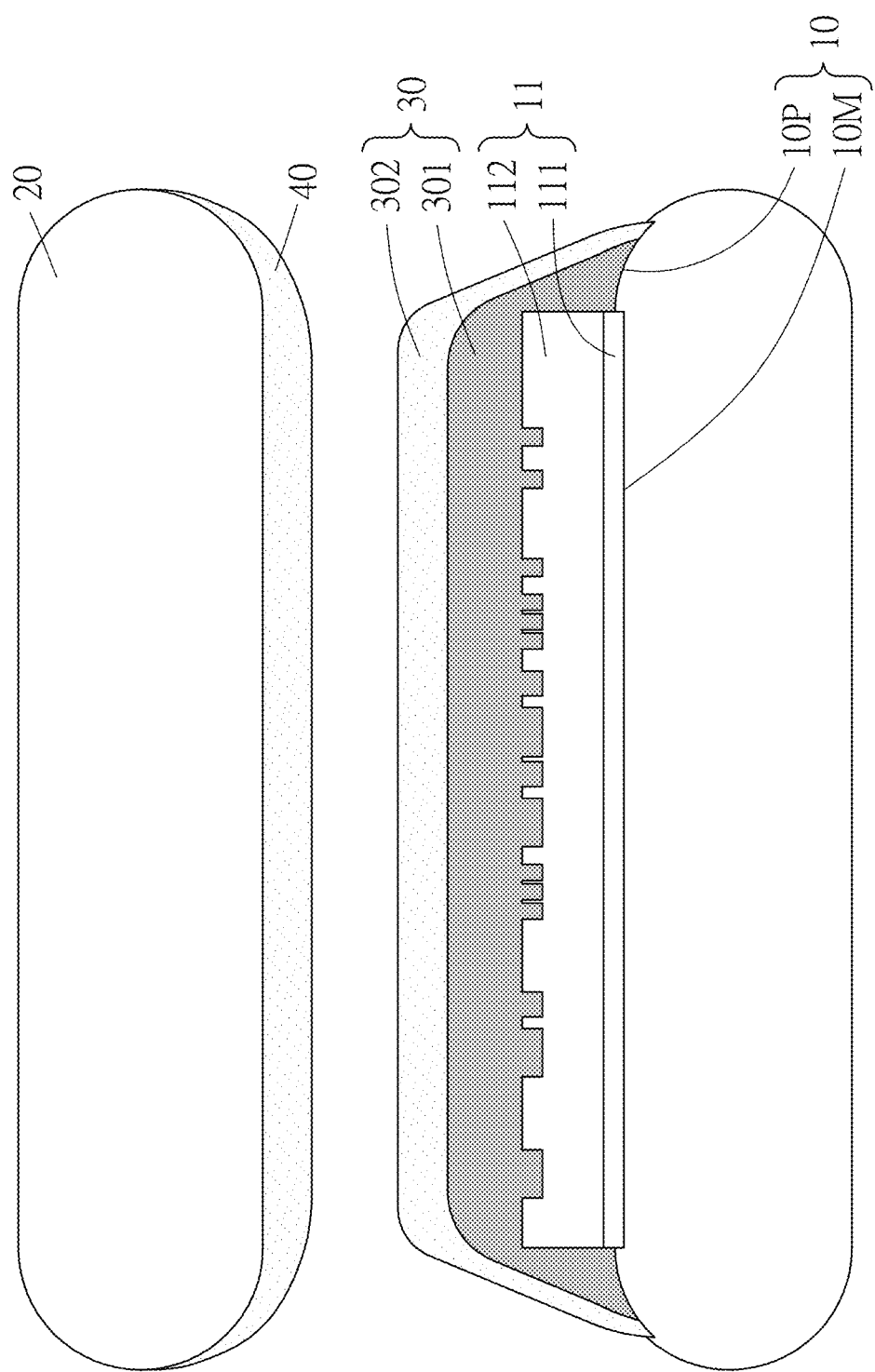
FIGS. 2 to 21 are schematic views showing some intermediate stages of the method depicted in FIG. 1.
Figure 3:
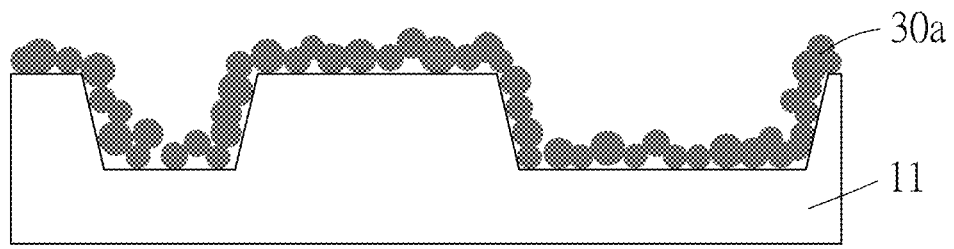
Figure 4:
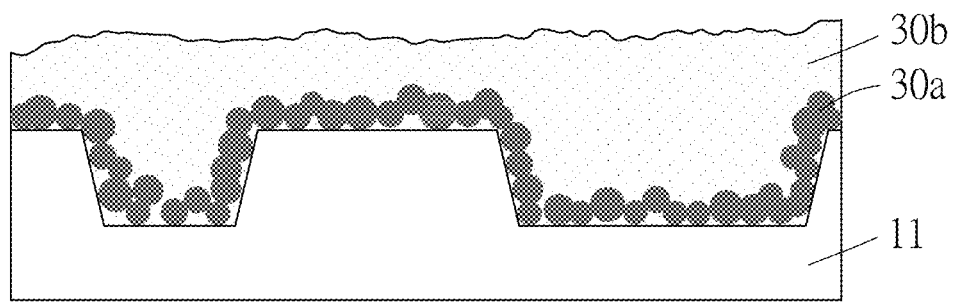
Figure 5:
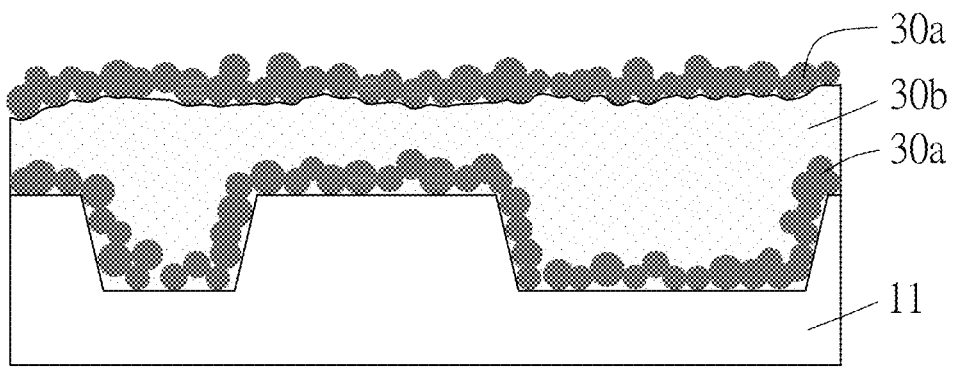
Figure 6:
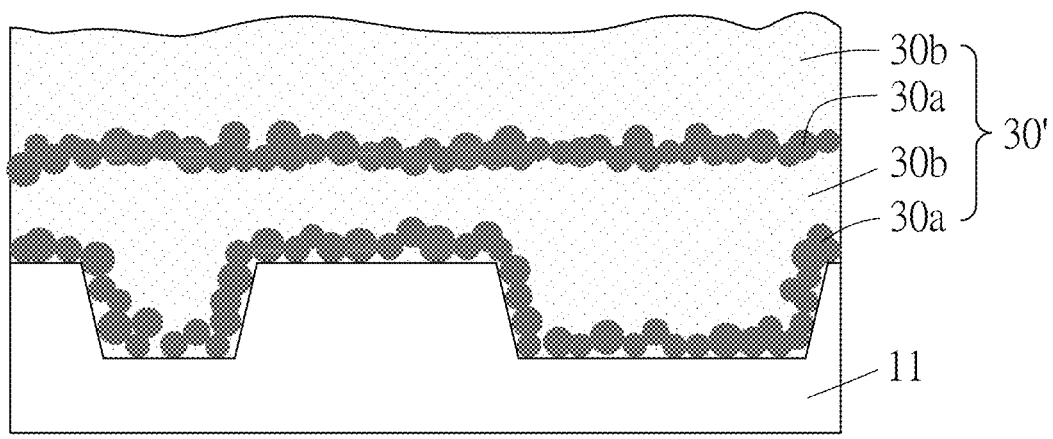

Referring to FIG. 1 and the example illustrated in FIG. 2, the method 100 begins at step S01, where a first bonding layer 30 is formed on a device substrate (a first substrate) 10. In some embodiments, the device substrate 10 is, for example, but not limited to, a device wafer, and is formed with a semiconductor device 11 thereon. In some embodiments, the semiconductor device 11 may be embedded into the device substrate 10, as shown in FIG. 2. In some embodiments, the semiconductor device 11 may be formed on the device substrate 10. The first bonding layer 30 is formed on the device substrate 10 to cover the semiconductor device 11.

The device substrate 10 has a main region 10M and a peripheral region 10P surrounding the main region 10M. The device substrate 10 may have a predetermined thickness and a predetermined radius such that the device substrate 10 are suitable to be processed in subsequent steps. In some exemplary embodiments, the device substrate 10 may be a "12 inch" substrate, i.e., having a radius of about 150 mm, with a thickness of about 765 µm to about 775 µm. Other size and/or thickness suitable for the device substrate 10 are within the contemplated scope of the present disclosure.

In some embodiments, the device substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in a crystal form, a polycrystalline form, or an amorphous form. Other suitable materials are within the contemplated scope of the present disclosure. A compound semiconductor includes two or more elements, and examples thereof may include, but not limited to, silicon carbide, gallium arsenide, gallium phosphide, indium phosphide, indium arsenide, indium antimonide, silicon germanium, gallium arsenide phosphide, aluminum indium arsenide, aluminum gallium arsenide, gallium indium arsenide, gallium indium phosphide, and gallium indium arsenide phosphide. Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor substrate. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure.

The semiconductor device 11 is formed on the main region 10M of the device substrate 10 so as to leave the peripheral region 10P unoccupied. In some embodiments, the semiconductor device 11 includes a first semiconductor device portion 111 disposed on the device substrate 10 and a second semiconductor device portion 112 disposed on the first semiconductor device portion 111. The first semiconductor device portion 111 includes a front-end-of-line (FEOL) part disposed on the device substrate 10 and a middle-end-of-line (MEOL) part disposed on the FEOL part. In some embodiments, the FEOL part includes, for example, but not limited to, a logic circuitry with transistors, a memory circuitry having memory elements, passive elements, and/or other suitable elements. In some embodiments, the MEOL part includes, for example, but not limited to, metal contacts to be electrically connected to electrodes of the elements in the FEOL part (for example, but not limited to, gate, source, and drain electrodes of the transistors), interlayer dielectric (ILD) layers among the metal contacts, and/or other suitable elements. The second semiconductor device portion 112 includes back-end-of-line (BEOL) part. In some embodiments, the BEOL part includes, for example, but not limited to, metallization layers (metal lines or vias) formed to electrically connect the metal contacts to an external circuitry out of the semiconductor device 11, and additional ILD layers among the metallization layers. The semiconductor device 11 may be formed using any appropriate materials and/or methods. In some embodiments, the BEOL part may further include a protective dielectric layer which is formed opposite to the MEOL part, and which may serve as an etch stop layer so as to protect other elements of the BEOL part formed therebeneath from being damaged due to steps performed subsequently. The protective dielectric layer may include a dielectric nitride such as silicon nitride, silicon carbon nitride, or other suitable materials. Other suitable materials and methods for forming the semiconductor device 11 are within the contemplated scope of the present disclosure.

The semiconductor device 11 may have a predetermined size and thickness according to layout of the design. In some exemplary embodiments, when the device substrate 10 is a "12 inch" wafer having a radius of about 150 mm, the main region 10M may have a radius of about 148 mm, and thus the peripheral region 10P is located to be spaced apart from a center of the device substrate 10 by a distance that ranges from about 148 mm to about 150 mm. It should be noted that other suitable sizes of the main region 10M and the peripheral region 10P are within the contemplated scope of the present disclosure. The peripheral region 10P of the device substrate 10 has a thickness which decreases gradually along a horizontal direction away from the main region 10M of the device substrate 10 due to a plurality of planarization processes (for example, but not limited to, chemical mechanic polishing (CMP) processes) conducted in the manufacturing process of the semiconductor device 11.

The first bonding layer 30 includes a first bonding sub-layer 301 disposed on the device substrate 10 to cover the semiconductor device 11, and a second bonding sub-layer 302 disposed on the first bonding sub-layer 301 opposite to the semiconductor device 11. The first bonding layer 30 includes a metal oxide-based composite.

Referring to the examples illustrated in FIGS. 2 to 10, in some embodiments, formation of the first bonding layer 30 includes the sub-steps described below.

Referring to the examples illustrated in FIGS. 2 to 6 and 8, a plurality of metal nanoparticle layers 30a and a plurality of metal oxide layers 30b are alternately formed on the device substrate 10 so as to form a metal oxide-based stack 30' which covers the semiconductor device 11. An uppermost one of the metal oxide layers 30b is an uppermost layer of the metal oxide-based stack 30' distal from the semiconductor device 11. In some embodiments, two metal nanoparticle layers 30a and two metal oxide layers 30b are alternately formed on the device substrate 10 to cover the semiconductor device 11 (see FIG. 6). In some embodiments, three or more metal nanoparticle layers 30a and three or more metal oxide layers 30b are alternately formed on the device substrate 10 to cover the semiconductor device 11 (see FIG. 8).

In some embodiments, formation of each of the metal nanoparticle layers 30a may be performed by a suitable deposition process as is known to those skilled in the art of semiconductor fabrication, for example, but not limited to, a spin-on coating process, a physical vapor deposition (PVD) process, a chemical vapor deposition (CVD) process, a plasma-enhanced chemical vapor deposition (PECVD) process, an atomic layer deposition (ALD) process, a plasma-enhanced atomic layer deposition (PEALD) process, or the like. Other suitable techniques are within the contemplated scope of the present disclosure. Each of the metal nanoparticle layers 30a includes a plurality of metal nanoparticles collectively configured as a film configuration. In some embodiments, the metal nanoparticles have a particle size ranging from about 5 nm to about 30 nm. If the particle size of the metal nanoparticles is less than 5 nm, a heat dissipation effect contributed by the metal nanoparticles is not significant. If the particle size of the metal nanoparticles is greater than 30 nm, a heat dissipation effect contributed by the metal nanoparticles cannot be further enhanced and the cost for forming the metal nanoparticle layers 30a is undesirably increased. In some embodiments, the metal nanoparticle layers 30a have a thermal conductivity ranging from about 300 W/m-k to about 450 W/m-k. In some embodiments, each of the metal nanoparticle layers 30a has a thickness ranging from about 5 nm to about 100 nm. If the thickness of each of the metal nanoparticle layers 30a is greater than 100 nm, a heat dissipation effect contributed by the metal nanoparticle layers 30a cannot be further enhanced and the cost for forming the metal nanoparticle layers 30a is undesirably increased. In some embodiments, the metal nanoparticle layers 30a include silver (Ag) nanoparticles, gold (Au) nanoparticles, ruthenium (Ru) nanoparticles, or combinations thereof.

In some embodiments, each of the metal oxide layers 30b is formed by a suitable deposition process as is known to those skilled in the art of semiconductor fabrication, for example, but not limited to, a spin-on coating process, a PVD process, a CVD process, a PECVD process, an ALD process, a PEALD process, or the like. Other suitable techniques are within the contemplated scope of the present disclosure. In some embodiments, the deposition process is conducted at a temperature ranging from about room temperature to about 300° C. so that each of the metal oxide layers 30b is formed in an amorphous state. If the deposition process is conducted at a temperature higher than 300° C., the metal oxide layers 30b may be undesirably converted to a crystalline state at this stage. In some embodiments, the deposition process is conducted at a temperature ranging from about 60° C. to about 300° C. In some embodiments, each of the metal oxide layers 30b may include a metal oxide material having a general formula represented by MOx, wherein M is selected from aluminum (Al), titanium (Ti), magnesium (Mg), zinc (Zn), nickel (Ni), or combinations thereof, and x is a number satisfying the valence of M. In some embodiments, the metal oxide material for forming the metal oxide layers 30b may include, for example, but not limited to, aluminum oxide, titanium oxide, magnesium oxide, zinc oxide, nickel oxide, or combinations thereof. Other suitable metal oxide materials are within the contemplated scope of the present disclosure. In some embodiments, each of the metal oxide layers 30b may have a thickness ranging from about 1500 Å to about 2500 Å. In some embodiments, the metal oxide layers 30b may include carbon (C) in an amount ranging from about 0 atomic % to about 10 atomic %. In some embodiments, the metal oxide layers 30b may have a density ranging from about 3.4 g/cm$^3$ to about 4.2 g/cm$^3$. In some embodiments, the metal oxide layers 30b may have a stress ranging from about 35 MPa about 150 MPa. In some embodiments, the uppermost one of the metal oxide layers 30b distal from the semiconductor device 11 has a roughness ranging from about 0 Å to about 50 Å.

Figure 7:
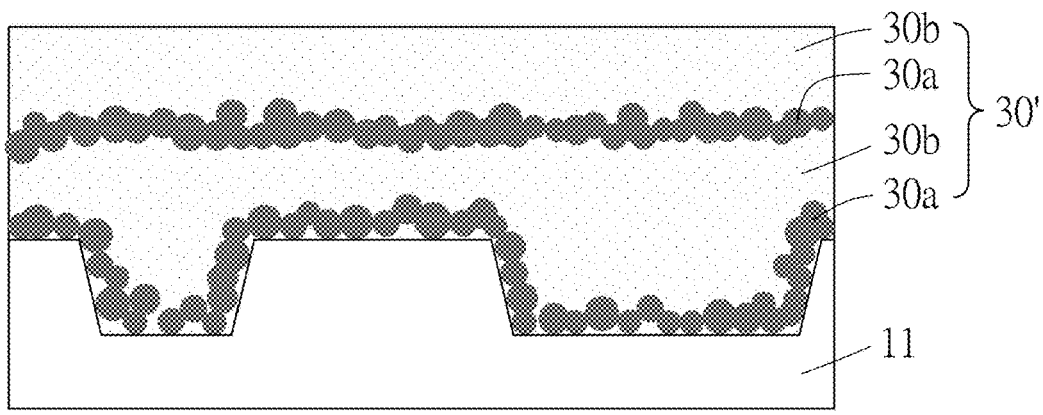
Figure 8:
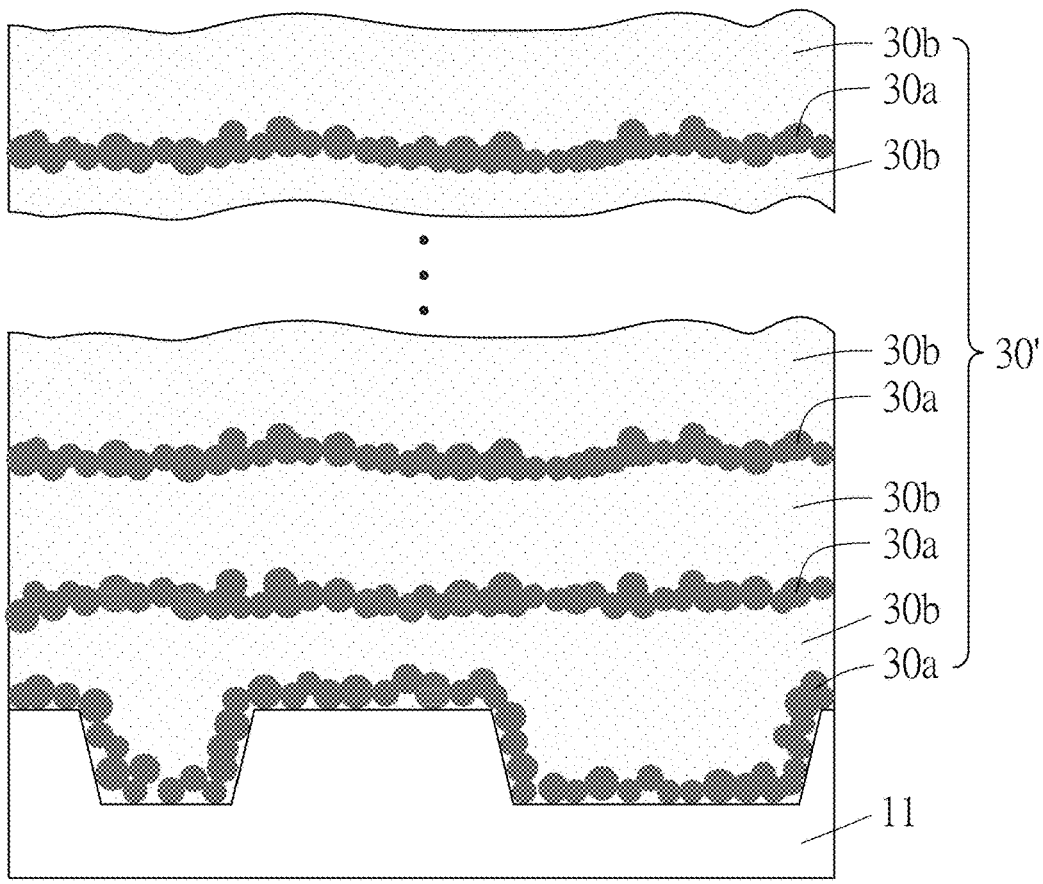
Figure 9:
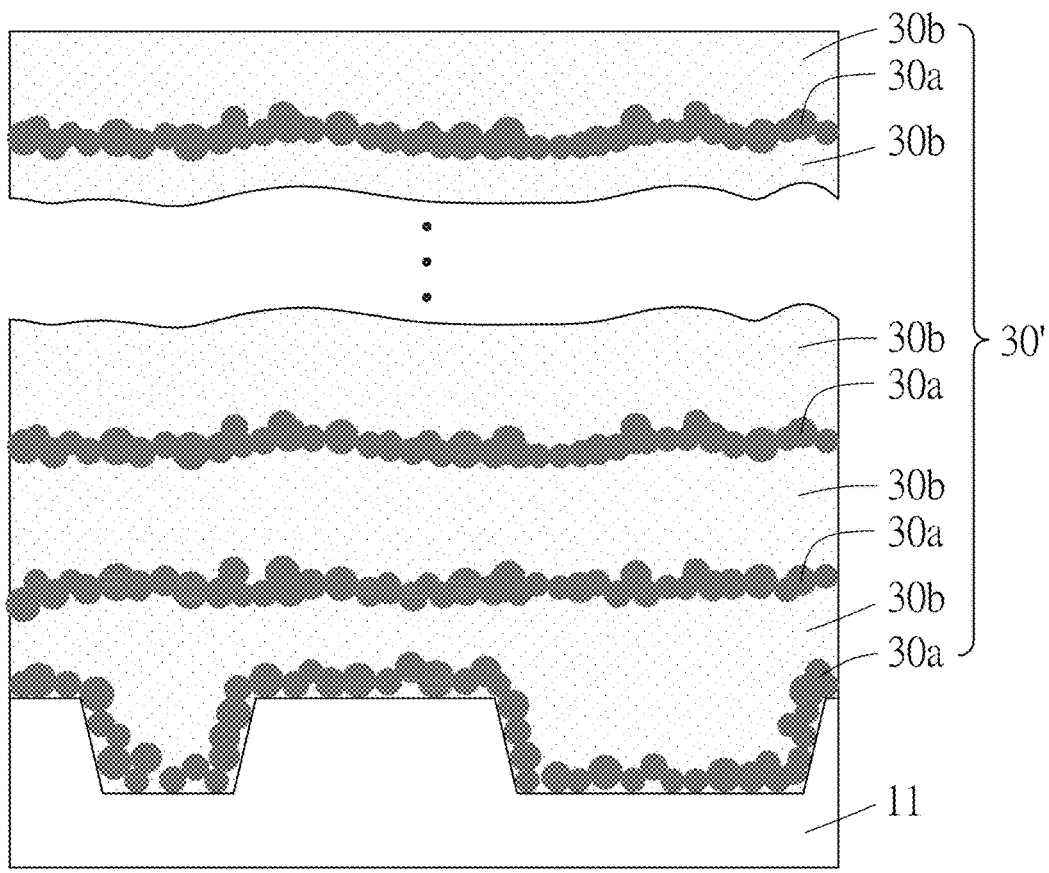

Referring to the examples illustrated in FIGS. 7 and 9, the uppermost one of the metal oxide layers 30b is subjected to a planarization process, e.g., a CMP process, so as to flatten an upper surface of the uppermost one of the metal oxide layers 30b. After the planarization process, the uppermost one of the metal oxide layers 30b of the metal oxide-based stack 30' may serve as the second bonding sub-layer 302, and the other layers of the metal oxide-based stack 30' (i.e., the metal nanoparticles layers 30a and the other layers of the metal oxide layers 30b) may collectively serve as the first bonding sub-layer 301. In some embodiments, the uppermost one of the metal oxide layers 30b of the metal oxide-based stack 30' has a thickness ranging from about 1500 Å to about 2500 Å. If the thickness of the uppermost one of the metal oxide layers 30b is less than 1500 Å, the topology of the semiconductor device 11 cannot be covered sufficiently by the uppermost one of the metal oxide layers 30b (i.e., the second bonding sub-layer 302). If the thickness of the uppermost one of the metal oxide layers 30b is greater than 2500 Å, the cost for forming the uppermost one of the metal oxide layers 30b is undesirably increased. In some embodiments, after the planarization process, the uppermost one of the metal oxide layers 30b (i.e., the second bonding sub-layer 302) has a roughness ranging from about 0 Å to about 10 Å.

Figure 10:
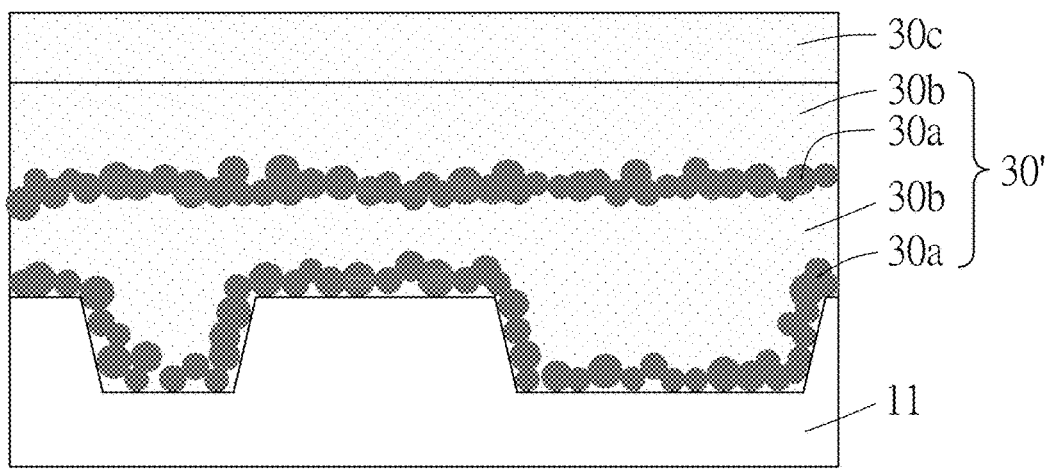

Referring to the example illustrated in FIG. 10, in some embodiments, a metal oxide layer 30c may be additionally formed on the metal oxide-based stack 30'. The processes for forming the metal oxide layer 30c, which includes a deposition process and a planarization process performed thereafter, may be the same as or similar to those for forming the uppermost one of the metal oxide layers 30b, and thus will not be discussed in detail for the sake of brevity. In addition, the material and the properties (for example, the amorphous form, the composition, the density, the stress, or the like) of the metal oxide layer 30c may be the same as or similar to those of the uppermost one of the metal oxide layers 30b, and thus will not be discussed in detail for the sake of brevity. In some embodiments, after the planarization process, the metal oxide layer 30c may have a topology value ranging from 0 Å to about 300 Å, a roughness ranging from about 0 Å to about 5 Å, and a thickness ranging from about 10 nm to about 200 nm. In this case, the metal oxide layer 30c serves as the second bonding sub-layer 302, and the metal oxide-based stack 30' serves as the first bonding sub-layer 301.

Referring to the examples illustrated in FIGS. 11 to 14, in some embodiments, formation of the first bonding layer 30 includes the sub-steps described below.

Figure 11:
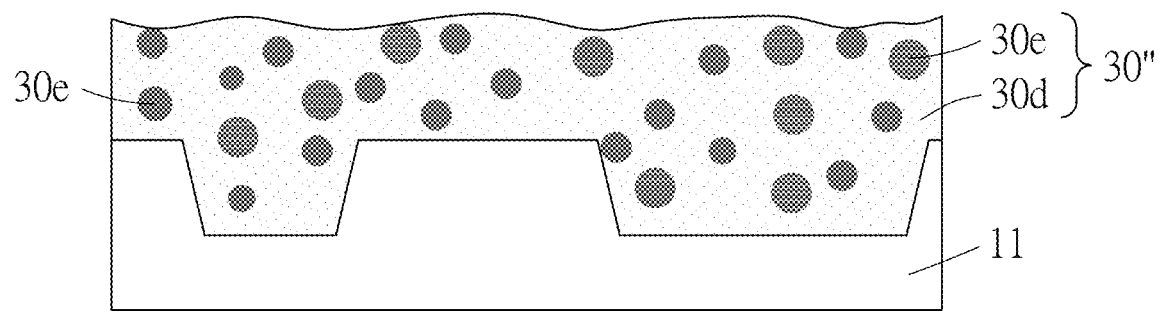
Figure 12:
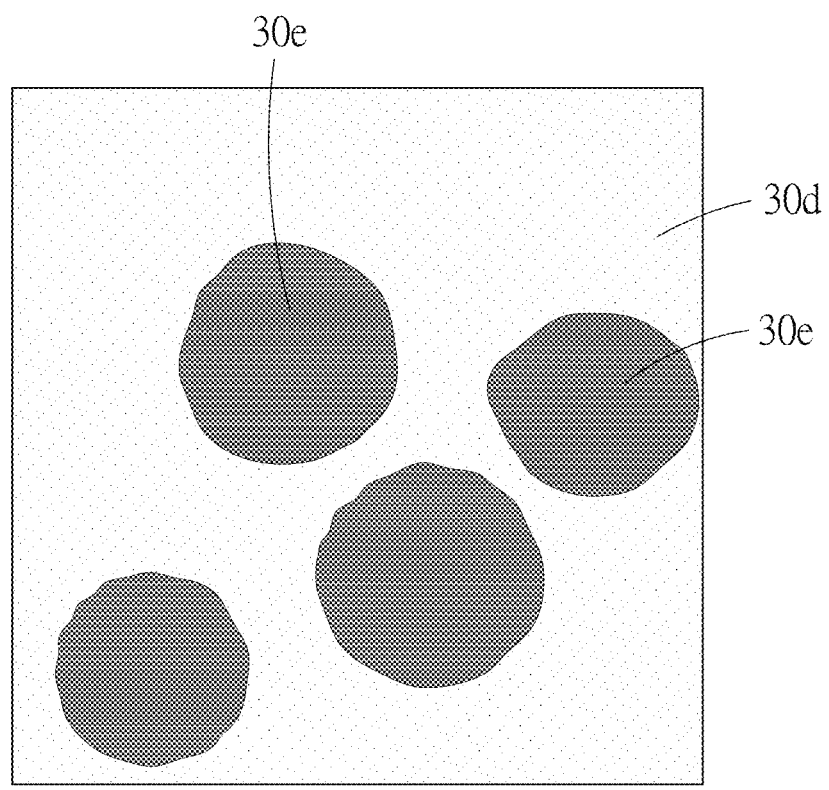

Referring to the examples illustrated in FIGS. 2 and 11, a doped metal oxide layer 30" is formed on the device substrate 10 to cover the semiconductor device 11. In some embodiments, the doped metal oxide layer 30" may be formed by a suitable deposition process as is known to those skilled in the art of semiconductor fabrication, for example, but not limited to, a spin-on coating process, a PVD process, a CVD process, a PECVD process, an ALD process, a PEALD process, or the like. Other suitable techniques are within the contemplated scope of the present disclosure. The doped metal oxide layer 30" is made of a metal oxide-based composite that includes a metal oxide matrix 30d and a plurality of metal nanoparticles 30e, which are doped into and dispersed in the metal oxide matrix 30d. In some embodiments, the metal oxide matrix 30d may include a metal oxide material having a general formula represented by MOx, wherein M is selected from aluminum (Al), titanium (Ti), magnesium (Mg), zinc (Zn), nickel (Ni), or combinations thereof, and x is a number satisfying the valence of M. In some embodiments, the metal oxide material for forming the metal oxide matrix 30d may include, for example, but not limited to, aluminum oxide, titanium oxide, magnesium oxide, zinc oxide, nickel oxide, or combinations thereof. Other suitable metal oxide materials are within the contemplated scope of the present disclosure. In some embodiments, the metal oxide matrix 30d may include carbon (C) in an amount ranging from about 0 atomic % to about 10 atomic %. In some embodiments, the deposition process is conducted at a temperature ranging from about room temperature to about 300° C. so as to permit the metal oxide matrix 30d to be formed in an amorphous state. If the deposition process is conducted at a temperature higher than 300° C., the metal oxide matrix 30d may be undesirably converted to a crystalline state at this stage. In some embodiments, the deposition process is conducted at a temperature ranging from about 60° C. to about 300° C. In some embodiments, the doped metal oxide layer 30" includes the metal nanoparticles 30e in an amount ranging from about 15 vol % to about 40 vol %. If the amount of the metal nanoparticles 30e included in the doped metal oxide layer 30" is less than 15 vol %, a heat dissipation effect contributed by the metal nanoparticles 30e is not significant. If the amount of the metal nanoparticles 30e included in the doped metal oxide layer 30" is greater than 40 vol %, aggregates of the metal nanoparticles 30e may be undesirably formed, resulting in an undesirable topology of the doped metal oxide layer 30". In some embodiments, the metal nanoparticles 30e have a particle size ranging from about 5 nm to about 30 nm. If the particle size of the metal nanoparticles 30e is less than 5 nm, a heat dissipation effect contributed by the metal nanoparticles 30e is not significant. If the particle size of the metal nanoparticles 30e is greater than 30 nm, the doped metal oxide layer 30" may have an undesirable thickness. In some embodiments, the doped metal oxide layer 30" has a thickness ranging from about 0.15 μm to about 5 μm. In some embodiments, the doped metal oxide layer 30" has a thermal conductivity ranging from about 20 W/m-k to about 150 W/m-k. The metal nanoparticles 30e are dispersed in the metal oxide matrix 30d and are spaced apart from each other (see FIG. 12). In some embodiments, the metal nanoparticles 30e include silver (Ag) nanoparticles, gold (Au) nanoparticles, ruthenium (Ru) nanoparticles, or combinations thereof.

Figure 13:
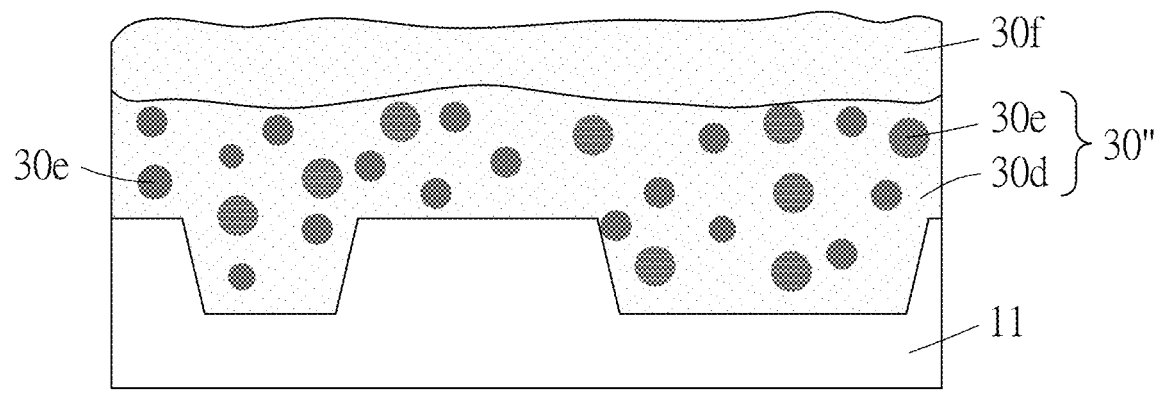
Figure 14:
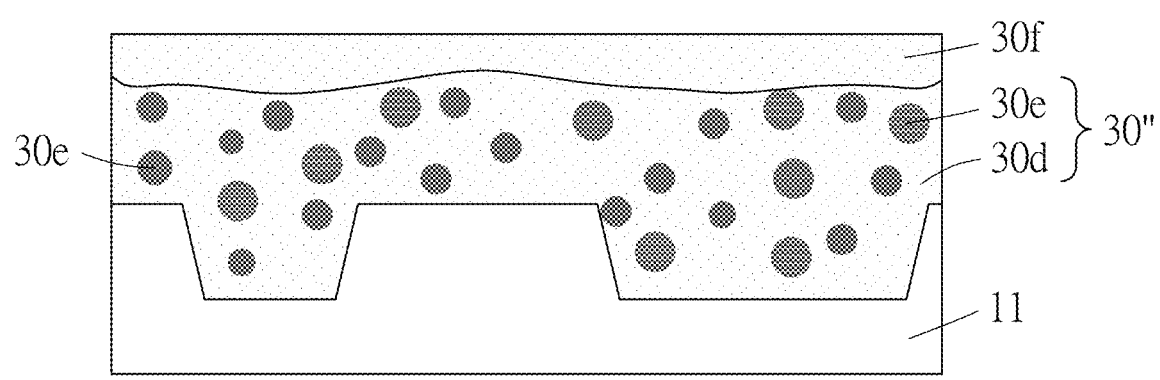

Referring to the examples illustrated in FIGS. 13 and 14, an undoped metal oxide layer 30f is formed on the doped metal oxide layer 30". The processes for forming the undoped metal oxide layer 30f, which includes a deposition process and a planarization process performed thereafter, may be the same as or similar to those for forming the uppermost one of the metal oxide layers 30b described with reference to FIGS. 4 to 9, and thus will not be discussed in detail for the sake of brevity. In addition, the material and the properties (for example, the thickness, the amorphous form, the composition, the density, the roughness, the stress, or the like) of the undoped metal oxide layer 30f may be the same as or similar to those of the uppermost one of the metal oxide layers 30b described above with reference to FIGS. 4 to 9, and thus will not be discussed in detail for the sake of brevity. In this case, the undoped metal oxide layer 30f serves as the second bonding sub-layer 302, and the doped metal oxide layer 30" serves as the first bonding sub-layer 301.

Figure 15:
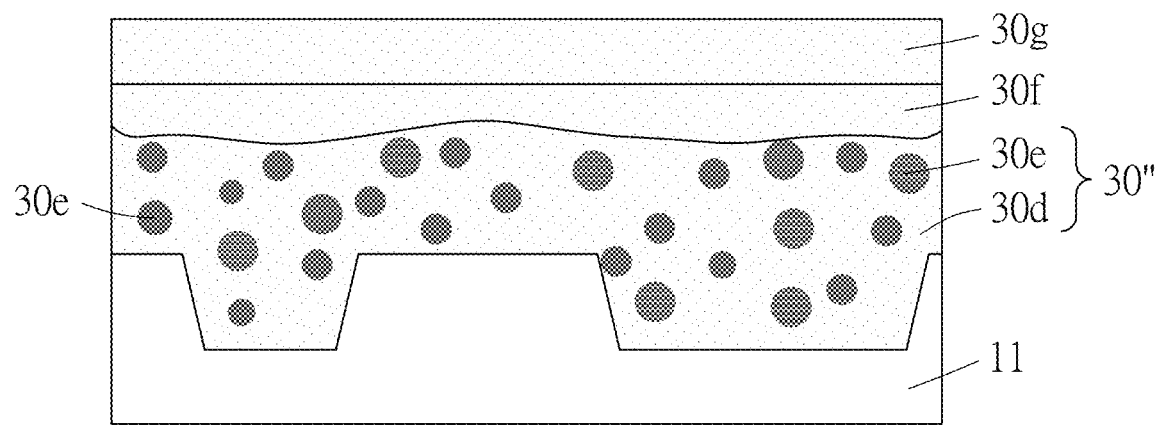

Referring to the example illustrated in FIG. 15, in some embodiments, an undoped metal oxide layer 30g can be additionally formed on the undoped metal oxide layer 30f opposite to the doped metal oxide layer 30". The processes for forming the undoped metal oxide layer 30g, which includes a deposition process and a planarization process performed thereafter, may be the same as or similar to those for forming the uppermost one of the metal oxide layers 30b described with reference to FIGS. 4 to 9, and thus will not be discussed in detail for the sake of brevity. In addition, the material and the properties (for example, the amorphous form, the composition, the density, the stress, or the like) of the undoped metal oxide layer 30g may be the same as or similar to those of the uppermost one of the metal oxide layers 30b, and thus will not be discussed in detail for the sake of brevity. In some embodiments, after the planarization process, the undoped metal oxide layer 30g may have a topology value ranging from 0 Å to about 300 Å, a roughness ranging from about 0 Å to about 5 Å, and a thickness ranging from about 10 nm to about 200 nm. In this case, the undoped metal oxide layer 30g serves as the second bonding sub-layer 302, and the undoped metal oxide layer 30f and the doped metal oxide layer 30" collectively serve as the first bonding sub-layer 301.

Figure 16:
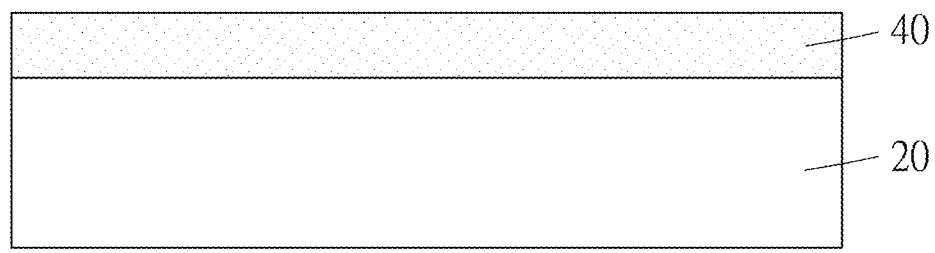
Figure 17:
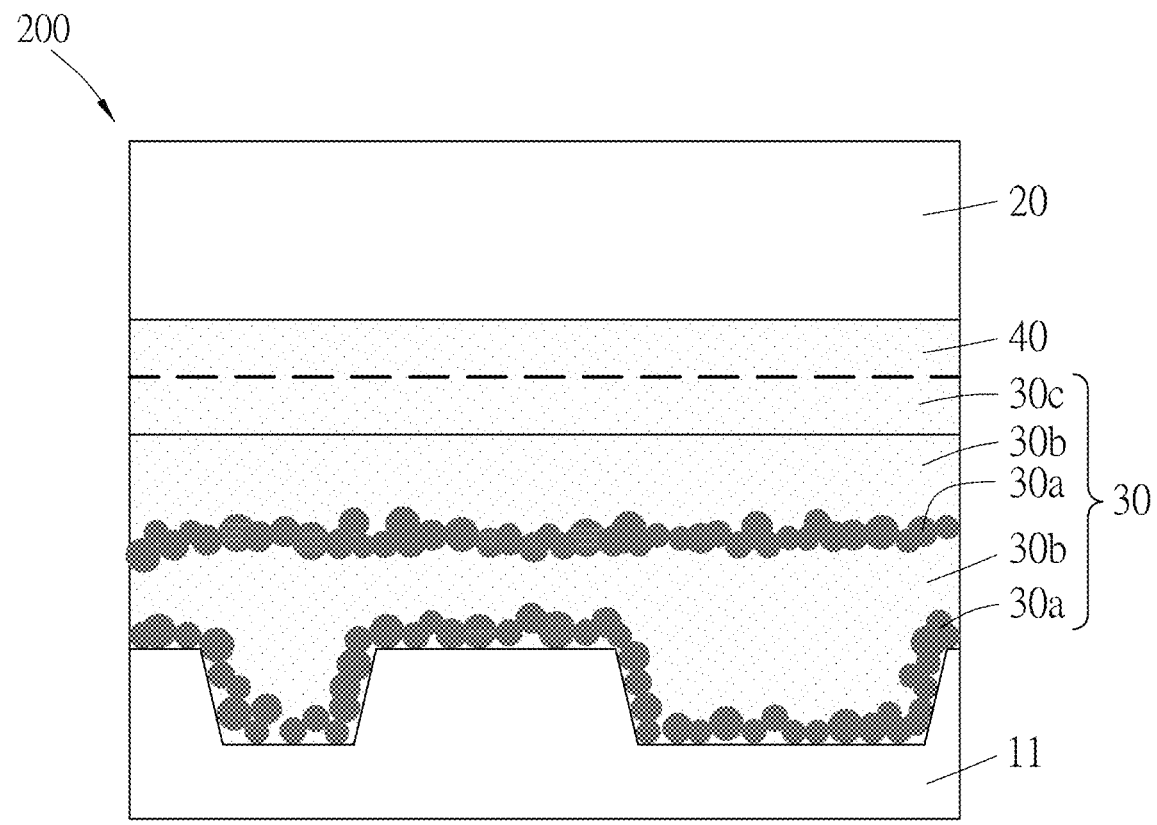
Figure 18:
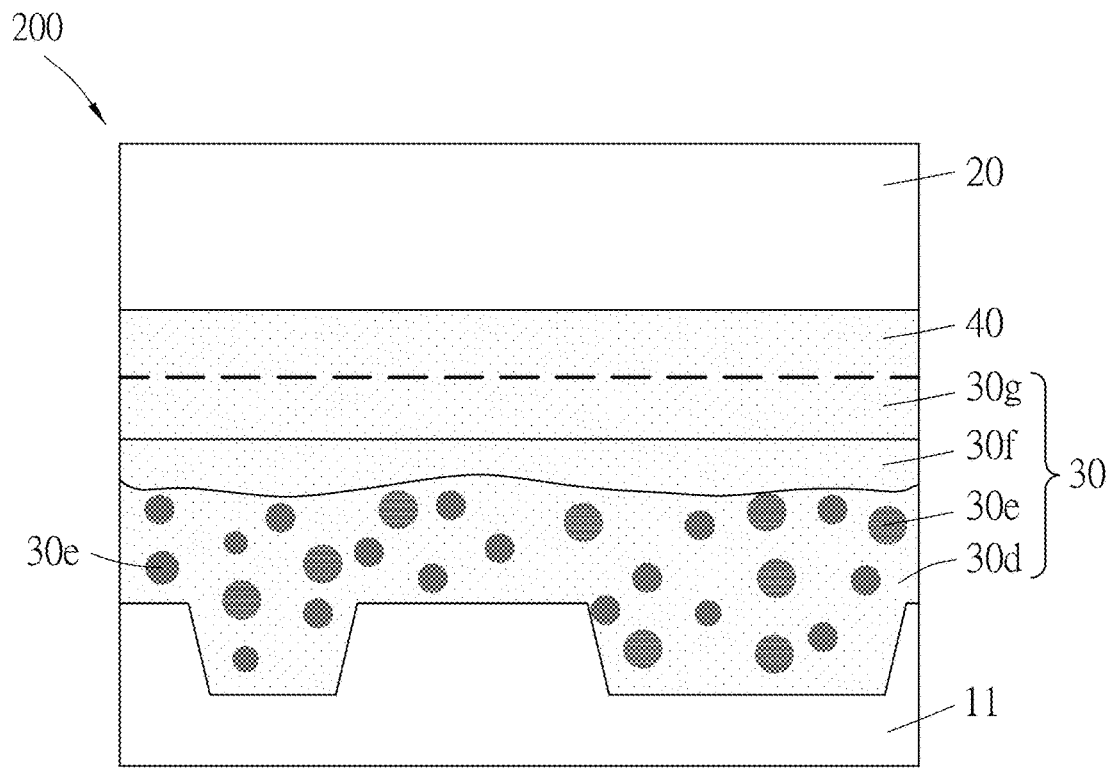
Figure 19:
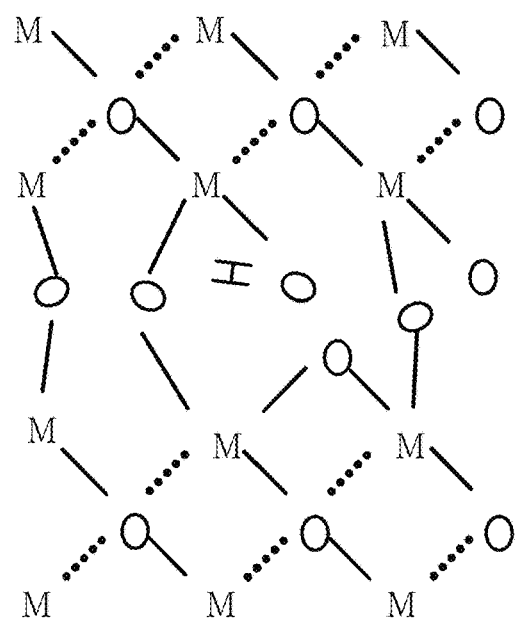
Figure 20:
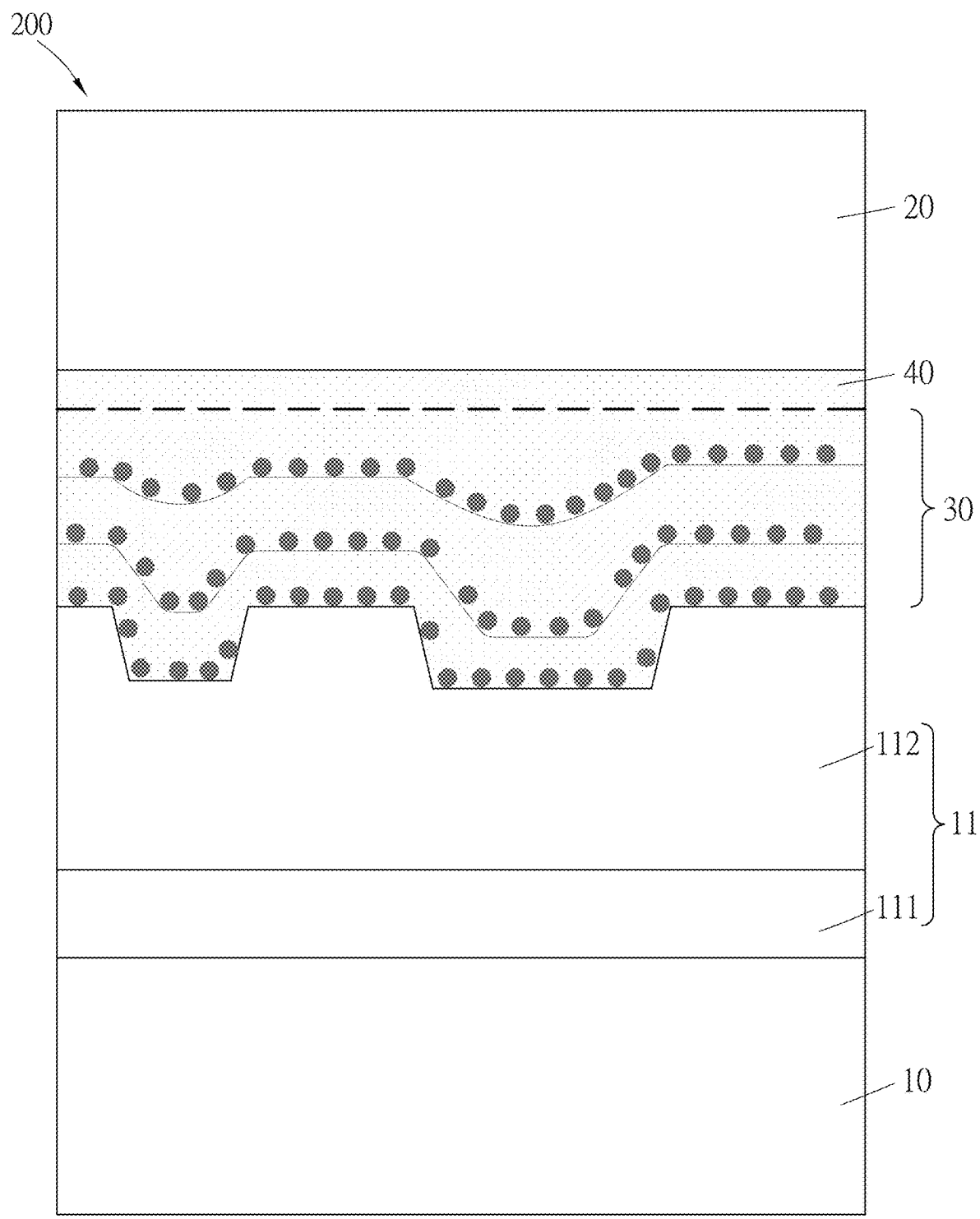
Figure 21:
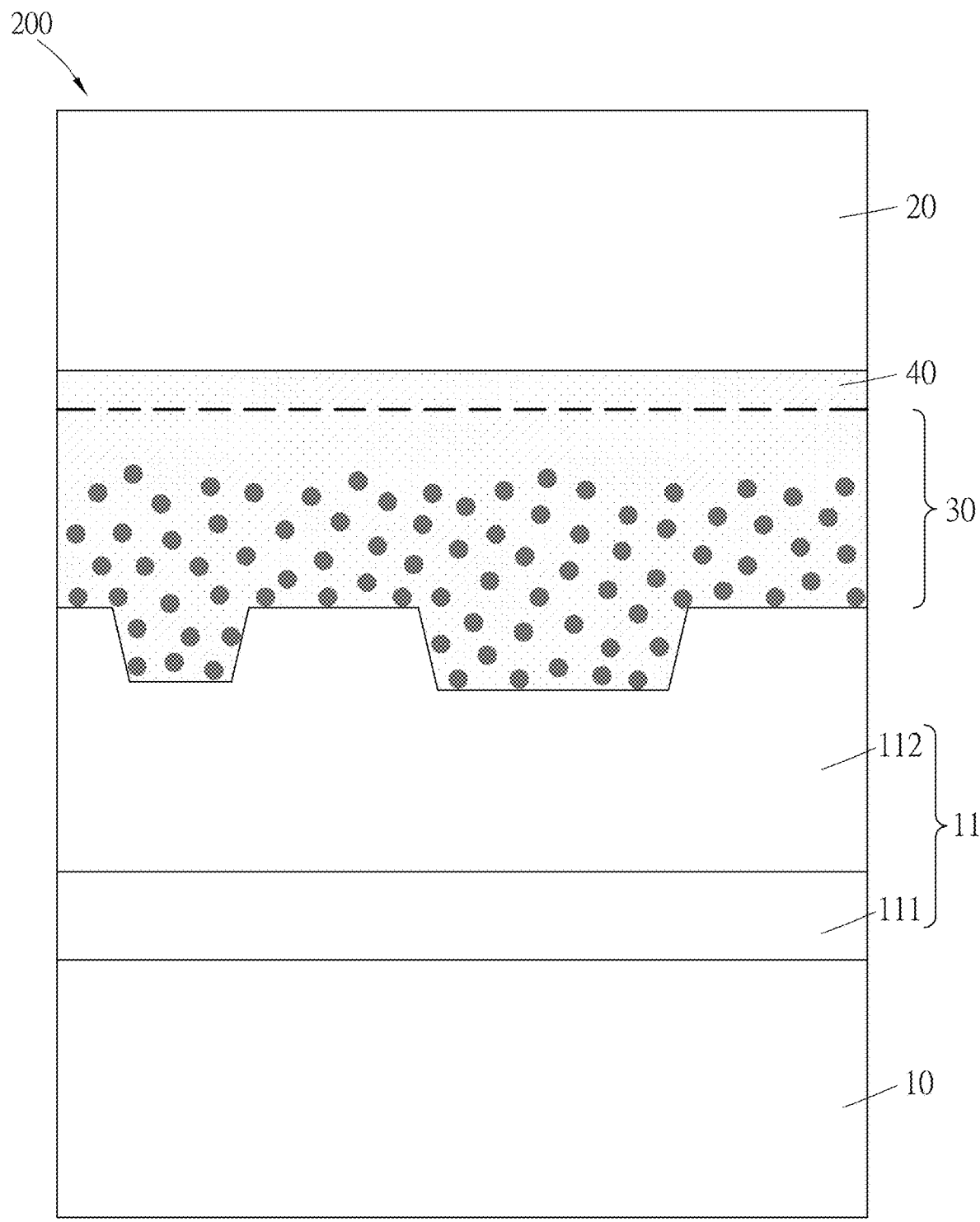

Referring to FIG. 1 and the examples illustrated in FIGS. 2 and 16, the method 100 proceeds to step S02, where a second bonding layer 40 is formed on a carrier substrate (a second substrate) 20.

The carrier substrate 20 may be, for example, but not limited to, a carrier wafer, and may include any suitable material which may be the same as or similar to that of the device substrate 10, and will not be discussed in detail for the sake of brevity. Other materials suitable for the carrier substrate 20 are within the contemplated scope of the present disclosure. In some embodiments, the carrier substrate 20 is a blank substrate. The carrier substrate 20 may have a predetermined thickness according to practical needs.

In some embodiments, the second bonding layer 40 is a metal oxide layer, which is formed on the carrier substrate 20 by a suitable deposition process as is known to those skilled in the art of semiconductor fabrication, for example, but not limited to, a spin-on coating process, a PVD process, a CVD process, a PECVD process, an ALD process, a PEALD process, or the like, followed by a planarization process, for example, but not limited to, a CMP process. Other suitable techniques of the deposition process and the planarization process are within the contemplated scope of the present disclosure. In some embodiments, the metal oxide layer includes a metal oxide material having a general formula represented by MOx, wherein M is selected from Al, Mg, Ti, Zn, Ni, or combinations thereof, and x is a number satisfying the valence of M. In some embodiments, the metal oxide material may include, for example, but not limited to, aluminum oxide, magnesium oxide, titanium oxide, zinc oxide, nickel oxide, or combinations thereof. Other suitable metal oxide materials are within the contemplated scope of the present disclosure. In some embodiments, the deposition process is conducted at a temperature ranging from about room temperature to about 300° C. so that the metal oxide layer (i.e., the second bonding layer 40) is formed in an amorphous state on the carrier substrate 20. If the deposition process is conducted at a temperature higher than 300° C., the metal oxide layer (i.e., the second bonding layer 40) may be undesirably converted to a crystalline state at this stage. In some embodiments, the deposition process is conducted at a temperature ranging from about room temperature to lower than about 260° C. In some embodiments, the deposition process is conducted at a temperature ranging from about room temperature to about 200° C. In some embodiments, the metal oxide layer (i.e., the second bonding layer 40) may have a thickness ranging from about 10 nm to about 200 nm. In some embodiments, the metal oxide layer (i.e., the second bonding layer 40) may include carbon (C) in an amount ranging from about 0 atomic % to about 10 atomic %. In some embodiments, the metal oxide layer (i.e., the second bonding layer 40) may have a density ranging from about 3.4 g/cm$^3$ to about 4.2 g/cm$^3$. In some embodiments, after the planarization process, the metal oxide layer (i.e., the second bonding layer 40) may have a topology value ranging from about 0 Å to 300 Å and a roughness ranging from about 0 Å to about 5 Å.

In some embodiments, the metal oxide-based stack 30' described above with reference to FIGS. 7 and 9 or the doped metal oxide layer 30" described above with reference to FIG. 11 may be formed on the carrier substrate 20 before the metal oxide layer is formed, such that the second bonding layer 40 includes the metal oxide layer and the metal oxide-based stack 30' or the doped metal oxide layer 30" sandwiched between the metal oxide layer and the carrier substrate 20. In this case, the metal oxide-based stack 30' or the doped metal oxide layer 30" serves as a first bonding sub-layer disposed on the carrier substrate 20, and the metal oxide layer serves as a second bonding sub-layer disposed on the first bonding sub-layer.

Referring to FIG. 1 and the example illustrated in FIG. 2, the method 100 proceeds to step S03, where a surface modification process is conducted on the first bonding layer 30 and the second bonding layer 40 so as to form M-OH bonds (wherein M is selected from Al, Ti, Mg, Zn, Ni, or combinations thereof) on the surface of the first bonding layer 30 and the surface of the second bonding layer 40 which face toward each other. In some embodiments, the surface modification process may be conducted by a plasma treatment process. In some embodiments, the plasma treatment process is conducted at a temperature ranging from about room temperature to about 300° C. so that the metal oxide materials included in the first bonding layer 30 and the second boning layer 40 are maintained in the amorphous state after the plasma treatment process. If the plasma treatment process is conducted at a temperature higher than 300° C., the metal oxide materials included in the first bonding layer 30 and the second boning layer 40 may be undesirably converted to the crystalline state after the plasma treatment process. In some embodiments, a gas source for conducting the plasma treatment process may include, for example, but not limited to, a gas mixture of oxygen ($O_2$) and hydrogen ($H_2$), a gas mixture of carbon dioxide ($CO_2$) and hydrogen ($H_2$), a gas mixture of nitrous oxide ($N_2O$) and hydrogen ($H_2$), or the like. Other suitable gases are within the contemplated scope of the present disclosure. In some embodiments, a rinsing process is conducted on the first bonding layer 30 and the second bonding layer 40 after the plasma treatment process, so as to increase the amount of the M-OH bonds formed on the surfaces of the first bonding layer 30 and the second bonding layer 40. In some embodiments, the rinsing process may be performed with deionized water. In some embodiments, the surface modification process may be conducted by a plasma treatment process which uses a gas source including nitrogen gas (N2), argon gas (Ar), or a combination thereof to generate plasma, followed by a rinsing process conducted with deionized water. In some embodiments, the surface modification process may be conducted by a wet chemical process. In some embodiments, the wet chemical process may be conducted using an aqueous solution of a high temperature sulfuric peroxide mixture (HTSPM), an aqueous solution of a low temperature sulfuric peroxide mixture (LTSPM), deionized water, an aqueous solution of hydrogen peroxide ($H_2O_2$), or the like. Other suitable aqueous chemical solutions are within the contemplated scope of the present disclosure.

Referring to FIG. 1 and the examples illustrated in FIGS. 17 to 21, the method 100 proceeds to step S04, where the device substrate 10 and the carrier substrate 20 are bonded to each other. The device substrate 10 and the carrier substrate 20 are mounted on an upper chuck and a lower chuck of a bonding apparatus (not shown), respectively, or vice versa. In some embodiments, the bonding apparatus is operated at about room temperature. In some embodiments, the upper chuck is operated at a chuck vacuum ranging from about 0 millibar (mbar) to about 90 mbar to permit one of the device substrate 10 and the carrier substrate 20 to be mounted thereon, and the lower chuck is operated at a chuck vacuum ranging from about 200 mbar to about 900 mbar to permit the other one of the device substrate 10 and the carrier substrate 20 to be mounted thereon. The device substrate 10 and the carrier substrate 20 are then aligned with each other and are brought toward each other, and a bonding force is applied onto a center of an upper surface of the carrier substrate 20 opposite to the device substrate 10 (or a center of an upper surface of the device substrate 10 opposite to the carrier substrate 20) using a pin of the bonding apparatus to allow the second bonding layer 40 to be in contact with the first bonding layer 30. In some embodiments, the bonding force ranges from about 0.7 N to about 1.2 N. As the second bonding layer 40 is brought in contact with the first bonding layer 30, the M-OH bonds polymerize to result in formation of M-O-M bonds (see FIG. 19) and water molecules ($H_2O$). As the bonding force is applied continuously, the water molecules diffuse away from an interface between the second bonding layer 40 and the first bonding layer 30, and the second bonding layer 40 starts to adhere with the first bonding layer 30 through the M-O-M bonds.

Referring to FIG. 1 and the examples illustrated in FIGS. 17 to 21, the method 100 proceeds to step S05, where the first bonding layer 30 and the second bonding layer 40 are annealed. The first bonding layer 30 and the second bonding layer 40 are annealed, such that the metal oxide materials included in the first bonding layer 30 and the second bonding layer 40 are converted from the amorphous state to the crystalline state and such that the water molecules are removed. In some embodiments, the first bonding layer 30 and the second bonding layer 40 are annealed at a temperature ranging from about 280° C. to about 450° C. If the first bonding layer 30 and the second bonding layer 40 are annealed at a temperature lower than 280° C., the metal oxide materials included in the first bonding layer 30 and the second bonding layer 40 cannot be converted from the amorphous state to the crystalline state. If the first bonding layer 30 and the second bonding layer 40 are annealed at a temperature higher than 450° C., the semiconductor structure 200 thus formed may be damaged. In some embodiments, the first bonding layer 30 and the second bonding layer 40 are annealed at a temperature ranging from about 300° C. to about 400° C. In some embodiments, the first bonding layer 30 and the second bonding layer 40 are annealed at a temperature ranging from about 325° C. to about 400° C. In some embodiments, the first bonding layer 30 and the second bonding layer 40 are annealed for a time period ranging from about 10 minutes to about 4 hours. If the first bonding layer 30 and the second bonding layer 40 are annealed for a time period of less than 10 minutes, the metal oxide materials included in the first bonding layer 30 and the second bonding layer 40 cannot be converted from the amorphous state to the crystalline state. In some embodiments, the first bonding layer 30 and the second bonding layer 40 are annealed at a pressure ranging from about $1 \times 10^{-3}$ Torr to about 760 Torr. A gap, which may be formed between first bonding layer 30 and the second bonding layer 40, is reduced after the annealing process.

When the semiconductor structure 200 thus formed is analyzed by transmission electron microscopy (TEM), the TEM images of the semiconductor structure 200 show that in some embodiments, when the first bonding layer 30 and the second bonding layer 40 are annealed at a temperature lower than 280° C., the metal oxide materials included in the first bonding layer 30 and the second bonding layer 40 are maintained in the amorphous state. When the first bonding layer 30 and the second bonding layer 40 are annealed at a temperature of about 280° C., the metal oxide materials included in the first bonding layer 30 and the second bonding layer 40 would begin to be converted from the amorphous state to the crystalline state. When the first bonding layer 30 and the second bonding layer 40 are annealed continuously at a temperature ranging from about 280° C. to about 450° C. for a time period ranging from about 10 minutes to about 4 hours, the metal oxide materials included in the first bonding layer 30 and the second bonding layer 40 are converted from the amorphous state to the crystalline state.

In the semiconductor structure 200 illustrated in FIGS. 17, 18, 20, and 21, the device substrate 10 and the carrier substrate 20 are bonded to each other through the first bonding layer 30 and the second bonding layer 40 in which the metal oxide materials in the crystalline state and the metal nanoparticles are included. A bonding strength produced between the first bonding layer 30 and the second bonding layer 40 ranges from about 1.6 $J/m^2$ to about 2.8 $J/m^2$. In addition, compared to a semiconductor structure in which a device substrate and a carrier substrate are bonded to each other through a silicon oxide bonding layer having a thermal conductivity of about 1 W/m-k, the metal nanoparticles have a thermal conductivity ranging from 300 W/m-k to about 450 W/m-k and the metal oxide material in the crystalline state has a thermal conductivity ranging from about 4 W/m-k to about 22 W/m-k, both of which are significantly higher than the thermal conductivity (i.e., about 1 W/m-k) of the silicon oxide bonding layer. Therefore, the first bonding layer 30 and the second bonding layer 40 can provide a superior heat dissipation effect for the semiconductor structure 200. In addition, the metal oxide materials included in the first bonding layer 30 and the second bonding layer 40 are in the crystalline state after the annealing process. Therefore, the first bonding layer 30 and the second bonding layer 40 formed between the device substrate 10 and the carrier substrate 20 can be thermally stable at a temperature up to about 800° C. and can withstand a dry clean process and/or a wet clean process which may be conducted in subsequent processing steps.

The semiconductor device 200 may be further processed so as to be utilized in different applications. For instance, in some embodiments, the semiconductor structure 200 is flipped over, and the device substrate 10 may be subjected to a planarization process, e.g., a CMP process, so as to expose the semiconductor device 11 for further processing. In some other embodiments, an optional step of removing an excess portion of the first bonding layer 30 located at a bottom side of the device substrate 10 opposite to the semiconductor device 11 may be performed.

In a method for manufacturing a semiconductor structure of the present disclosure, a first bonding layer and a second bonding layer are formed on a device substrate and a carrier substrate, respectively. The first bonding layer includes a metal oxide material and metal nanoparticles, and the second bonding layer includes a metal oxide material which may be the same as or similar to the metal oxide material of the first bonding layer and optionally metal nanoparticles which may be the same as or similar to the metal nanoparticles of the first bonding layer. The device substrate and the carrier substrate are bonded to each other through the first and second bonding layers. The metal oxide materials included in the first and second bonding layers are converted from an amorphous state to a crystalline state after an annealing process, and the metal oxide materials in the crystalline state and the metal nanoparticles have a high thermal conductivity, such that the first and second bonding layers provide a superior heat dissipation effect for the semiconductor structure. In addition, the first bonding layer and the second bonding layer, which include the metal oxide materials in the crystalline state and which are formed between the device substrate and the carrier substrate, can withstand a dry clean process and/or a wet clean process which may be conducted in subsequent processing steps.

In accordance with some embodiments of the present disclosure, a method for manufacturing a semiconductor structure includes: forming a first bonding layer on a device substrate formed with a semiconductor device so as to cover the semiconductor device, the first bonding layer including a first bonding sub-layer disposed on the device substrate and a second bonding sub-layer disposed on the first bonding sub-layer opposite to the semiconductor device, the first bonding sub-layer including a first metal oxide material in an amorphous state and a plurality of metal nanoparticles, the second bonding sub-layer including a second metal oxide material in an amorphous state; forming a second bonding layer on a carrier substrate, the second bonding layer including a third metal oxide material in an amorphous state; conducting a surface modification process on the first bonding layer and the second bonding layer; bonding the device substrate and the carrier substrate to each other through the first bonding layer and the second bonding layer; and annealing the first bonding layer and the second bonding layer so as to convert the first metal oxide material, the second metal oxide material, and the third metal oxide material from the amorphous state to a crystalline state.

In accordance with some embodiments of the present disclosure, formation of the first bonding layer includes: alternately forming a plurality of metal nanoparticle layers and a plurality of metal oxide layers on the device substrate so as to form a metal oxide-based stack which covers the semiconductor device, an uppermost one of the metal oxide layers serving as an uppermost layer of the metal oxide-based stack distal from the semiconductor device, each of the metal nanoparticle layers including a plurality of the metal nanoparticles; and subjecting the uppermost one of the metal oxide layers to planarization. The uppermost one of the metal oxide layers serves as the second bonding sub-layer, and the metal nanoparticle layers and the other ones of the metal oxide layers collectively serve as the first bonding sub-layer.

In accordance with some embodiments of the present disclosure, each of the metal oxide layers is formed by a deposition process conducted at a temperature ranging from about room temperature to about 300° C.

In accordance with some embodiments of the present disclosure, the uppermost one of the metal oxide layers includes the second metal oxide material. Each of the other ones of the metal oxide layers includes the first metal oxide material. Each of the first metal oxide material, the second oxide material, and the third metal oxide material has a general formula of $MO_x$, wherein M is selected from Al, Ti, Mg, Zn, Ni, or combinations thereof and x is a number satisfying the valence of M, and the first metal oxide material, the second oxide material, and the third metal oxide material are the same as or different from one another. M-OH bonds are formed on a surface of the first bonding layer and a surface of the second bonding layer which face toward each other after the surface modification process. The M-OH bonds polymerize to result in formation of M-O-M bonds and water molecules. The first bonding layer and the second bonding layer are bonded to each other through the M-O-M bonds.

In accordance with some embodiments of the present disclosure, formation of the first bonding layer includes: alternately forming a plurality of metal nanoparticle layers and a plurality of metal oxide layers on the device substrate so as to form a metal oxide-based stack which covers the semiconductor device, each of the metal nanoparticles layers including a plurality of the metal nanoparticles; forming an additional metal oxide layer on the metal oxide-based stack opposite to the semiconductor device; and subjecting the additional metal oxide layer to planarization. The metal oxide-based stack serves as the first bonding sub-layer, and the additional metal oxide layer serves as the second bonding sub-layer.

In accordance with some embodiments of the present disclosure, each of the additional metal oxide layer and the metal oxide layers of the metal oxide-based stack is formed by a deposition process conducted at a temperature ranging from about room temperature to about 300° C.

In accordance with some embodiments of the present disclosure, the additional metal oxide layer includes the second metal oxide material. Each of the metal oxide layers of the metal oxide-based stack includes the first metal oxide material. Each of the first metal oxide material, the second oxide material, and the third metal oxide material has a general formula of MOx, wherein M is selected from Al, Ti, Mg, Zn, Ni, or combinations thereof and x is a number satisfying the valence of M, and the first metal oxide material, the second oxide material, and the third metal oxide material are the same as or different from one another. M-OH bonds are formed on a surface of the first bonding layer and a surface of the second bonding layer which face toward each other after the surface modification process. The M-OH bonds polymerize to result in formation of M-O-M bonds and water molecules. The first bonding layer and the second bonding layer are bonded to each other through the M-O-M bonds.

In accordance with some embodiments of the present disclosure, formation of the first bonding layer includes: forming a doped metal oxide layer on the device substrate to cover the semiconductor device, the doped metal oxide layer including a metal oxide matrix and the metal nanoparticles doped into the metal oxide matrix; forming an undoped metal oxide layer on the doped metal oxide layer opposite to the semiconductor device; and subjecting the undoped metal oxide layer to planarization. The doped metal oxide layer serves as the first bonding sub-layer, and the undoped metal oxide layer serves as the second bonding sub-layer.

In accordance with some embodiments of the present disclosure, each of the doped metal oxide layer and the undoped metal oxide layer is formed by a deposition process conducted at a temperature ranging from about room temperature to about 300° C.

In accordance with some embodiments of the present disclosure, the metal oxide matrix includes the first metal oxide material, and the undoped metal oxide layer includes the second metal oxide material. Each of the first metal oxide material, the second metal oxide material, and the third metal oxide material has a general formula of MOx, wherein M is selected from Al, Ti, Mg, Zn, Ni, or combinations thereof, and x is a number satisfying the valence of M, and the first metal oxide material, the second oxide material, and the third metal oxide material are the same as or different from one another. M-OH bonds are formed on a surface of the first bonding layer and a surface of the second bonding layer which face toward each other after the surface modification process. The M-OH bonds polymerize to result in formation of M-O-M bonds and water molecules. The first bonding layer and the second bonding layer are bonded to each other through the M-O-M bonds.

In accordance with some embodiments of the present disclosure, formation of the first bonding layer includes: forming a doped metal oxide layer on the device substrate to cover the semiconductor device, the doped metal oxide layer including a metal oxide matrix and the metal nanoparticles doped into the metal oxide matrix; forming a first undoped metal oxide layer on the doped metal oxide layer opposite to the semiconductor device; forming a second undoped metal oxide layer on the first undoped metal oxide layer opposite to the doped metal oxide layer; and subjecting the second undoped metal oxide layer to planarization. The doped metal oxide layer and the first undoped metal oxide layer collectively serve as the first bonding sub-layer, and the second undoped metal oxide layer serves as the second bonding sub-layer.

In accordance with some embodiments of the present disclosure, each of the doped metal oxide layer, the first undoped metal oxide layer, and the second undoped metal oxide layer is formed by a deposition process conducted at a temperature ranging from about room temperature to about 300° C.

In accordance with some embodiments of the present disclosure, each of the metal oxide matrix and the first undoped metal oxide layer includes the first metal oxide material, and the second undoped metal oxide layer includes the second metal oxide material. Each of the first metal oxide material, the second oxide material, and the third metal oxide material has a general formula of MOx, wherein M is selected from Al, Ti, Mg, Zn, Ni, or combinations thereof, and x is a number satisfying the valence of M, and the first metal oxide material, the second oxide material, and the third metal oxide material are the same as or different from one another. M-OH bonds are formed on a surface of the first bonding layer and a surface of the second bonding layer which face toward each other after the surface modification process. The M-OH bonds polymerize to result in formation of M-O-M bonds and water molecules. The first bonding layer and the second bonding layer are bonded to each other through the M-O-M bonds.

In accordance with some embodiments of the present disclosure, the metal nanoparticles include silver nanoparticles, gold nanoparticles, ruthenium nanoparticles, or combinations thereof.

In accordance with some embodiments of the present disclosure, a method for manufacturing a semiconductor structure includes: forming a first bonding layer on a device substrate formed with a semiconductor device so as to cover the semiconductor device, the first bonding layer including a first bonding sub-layer disposed on the device substrate and a second bonding sub-layer disposed on the first bonding sub-layer opposite to the semiconductor device, the first bonding sub-layer including a first metal oxide material in an amorphous state and a plurality of first metal nanoparticles, the second bonding sub-layer including a second metal oxide material in an amorphous state; forming a second bonding layer on a carrier substrate, the second bonding layer including a first bonding sub-layer disposed on the carrier substrate and a second bonding sub-layer disposed on the first bonding sub-layer of the second bonding layer opposite to the carrier substrate, the first bonding sub-layer of the second bonding layer including a third metal oxide material in an amorphous state and a plurality of second metal nanoparticles, the second bonding sub-layer of the second bonding layer including a fourth metal oxide material in an amorphous state; conducting a surface modification process on the first bonding layer and the second bonding layer; bonding the device substrate and the carrier substrate to each other through the first bonding layer and the second bonding layer; and annealing the first bonding layer and the second bonding layer so as to convert the first metal oxide material, the second metal oxide material, the third metal oxide material, and the fourth metal oxide material from the amorphous state to a crystalline state.

In accordance with some embodiments of the present disclosure, the surface modification process is conducted by a wet chemical process using an aqueous solution of a high temperature sulfuric peroxide mixture, an aqueous solution of a low temperature sulfuric peroxide mixture, deionized water, an aqueous solution of hydrogen peroxide, or combinations thereof.

In accordance with some embodiments of the present disclosure, the first bonding layer and the second bonding layer are annealed at a temperature ranging from about 280° C. to about 450° C.

In accordance with some embodiments of the present disclosure, a semiconductor structure includes a first substrate, a semiconductor device, a first bonding layer, a second substrate, and a second bonding layer. The semiconductor device is disposed on the first substrate. The first bonding layer is disposed on the first substrate to cover the semiconductor device. The first bonding layer includes a first bonding sub-layer disposed on the first substrate and a second bonding sub-layer disposed on the first bonding sub-layer opposite to the semiconductor device. The first bonding sub-layer includes a first metal oxide material in a crystalline state and a plurality of metal nanoparticles. The second bonding sub-layer includes a second metal oxide material in a crystalline state. The second bonding layer is disposed on the second substrate and includes a third metal oxide material in a crystalline state. The first substrate and the second substrate are bonded to each other through the first bonding layer and the second bonding layer.

In accordance with some embodiments of the present disclosure, the first bonding layer includes a metal oxide-based stack disposed on the first substrate. The metal oxide-based stack includes a plurality of metal nanoparticle layers and a plurality of metal oxide layers disposed to alternate with one another. Each of the metal nanoparticle layers includes the metal nanoparticles. An uppermost one of the metal oxide layers is an uppermost layer of the metal oxide-based stack distal from the semiconductor device, such that the uppermost one of the metal oxide layers serves as the second bonding sub-layer and such that the metal nanoparticle layers and the other ones of the metal oxide layers collectively serve as the first bonding sub-layer.

In accordance with some embodiments of the present disclosure, the first bonding layer includes a doped metal oxide layer disposed on the first substrate to cover the semiconductor device and an undoped metal oxide layer disposed on the doped metal oxide layer opposite to the semiconductor device, such that the doped metal oxide layer serves as the first bonding sub-layer, and such that the undoped metal oxide layer serves as the second bonding sub-layer. The doped metal oxide layer includes a metal oxide matrix and the metal nanoparticles doped into the metal oxide matrix. The metal oxide matrix includes the first metal oxide material. The undoped metal oxide layer includes the second metal oxide material.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a first bonding layer on a device substrate formed with a semiconductor device so as to cover the semiconductor device, the first bonding layer including a first bonding sub-layer disposed on the device substrate and a second bonding sub-layer disposed on the first bonding sub-layer opposite to the semiconductor device, the first bonding sub-layer including a first metal oxide material in an amorphous state and a plurality of metal nanoparticles, the second bonding sub-layer including a second metal oxide material in an amorphous state;
    forming a second bonding layer on a carrier substrate, the second bonding layer including a third metal oxide material in an amorphous state;
    conducting a surface modification process on the first bonding layer and the second bonding layer;
    bonding the device substrate and the carrier substrate to each other through the first bonding layer and the second bonding layer; and
    annealing the first bonding layer and the second bonding layer so as to convert the first metal oxide material, the second metal oxide material, and the third metal oxide material from the amorphous state to a crystalline state.

2. The method according to claim 1, wherein formation of the first bonding layer includes:
    alternately forming a plurality of metal nanoparticle layers and a plurality of metal oxide layers on the device substrate so as to form a metal oxide-based stack which covers the semiconductor device, an uppermost one of the plurality of metal oxide layers serving as an uppermost layer of the metal oxide-based stack distal from the semiconductor device, each of the plurality of metal nanoparticle layers including a plurality of the metal nanoparticles; and
    subjecting the uppermost one of the plurality of metal oxide layers to planarization,
    wherein the uppermost one of the plurality of metal oxide layers serves as the second bonding sub-layer, and the plurality of metal nanoparticle layers and the other ones of the plurality of metal oxide layers collectively serve as the first bonding sub-layer.

3. The method according to claim 2, wherein each of the plurality of metal oxide layers is formed by a deposition process conducted at a temperature ranging from room temperature to 300° C.

4. The method according to claim 2, wherein
    the uppermost one of the plurality of metal oxide layers includes the second metal oxide material;
    each of the other ones of the plurality of metal oxide layers includes the first metal oxide material;
    each of the first metal oxide material, the second oxide material, and the third metal oxide material has a formula of MOx, wherein M is selected from Al, Ti, Mg, Zn, Ni, or combinations thereof and x is a number satisfying the valence of M, and the first metal oxide material, the second oxide material, and the third metal oxide material are the same as or different from one another;

M-OH bonds are formed on a surface of the first bonding layer and a surface of the second bonding layer which face toward each other after the surface modification process; and the M-OH bonds polymerize to result in formation of M-O-M bonds and water molecules, the first bonding layer and the second bonding layer being bonded to each other through the M-O-M bonds.

5. The method according to claim 1, wherein formation of the first bonding layer includes:

alternately forming a plurality of metal nanoparticle layers and a plurality of metal oxide layers on the device substrate so as to form a metal oxide-based stack which covers the semiconductor device, each of the plurality of metal nanoparticles layers including a plurality of the metal nanoparticles;

forming an additional metal oxide layer on the metal oxide-based stack opposite to the semiconductor device; and subjecting the additional metal oxide layer to planarization, wherein the metal oxide-based stack serves as the first bonding sub-layer, and the additional metal oxide layer serves as the second bonding sub-layer.

6. The method according to claim 5, wherein each of the additional metal oxide layer and the plurality of metal oxide layers of the metal oxide-based stack is formed by a deposition process conducted at a temperature ranging from room temperature to 300° C.

7. The method according to claim 5, wherein the additional metal oxide layer includes the second metal oxide material;

each of the plurality of metal oxide layers of the metal oxide-based stack includes the first metal oxide material;

each of the first metal oxide material, the second oxide material, and the third metal oxide material has a formula of MOx, wherein M is selected from Al, Ti, Mg, Zn, Ni, or combinations thereof and x is a number satisfying the valence of M, and the first metal oxide material, the second oxide material, and the third metal oxide material are the same as or different from one another;

M-OH bonds are formed on a surface of the first bonding layer and a surface of the second bonding layer which face toward each other after the surface modification process; and the M-OH bonds polymerize to result in formation of M-O-M bonds and water molecules, the first bonding layer and the second bonding layer being bonded to each other through the M-O-M bonds.

8. The method according to claim 1, wherein formation of the first bonding layer includes:

forming a doped metal oxide layer on the device substrate to cover the semiconductor device, the doped metal oxide layer including a metal oxide matrix and the metal nanoparticles doped into the metal oxide matrix;

forming an undoped metal oxide layer on the doped metal oxide layer opposite to the semiconductor device; and subjecting the undoped metal oxide layer to planarization, wherein the doped metal oxide layer serves as the first bonding sub-layer, and the undoped metal oxide layer serves as the second bonding sub-layer.

9. The method according to claim 8, wherein each of the doped metal oxide layer and the undoped metal oxide layer is formed by a deposition process conducted at a temperature ranging from room temperature to 300° C.

10. The method according to claim 8, wherein the metal oxide matrix includes the first metal oxide material, and the undoped metal oxide layer includes the second metal oxide material;

each of the first metal oxide material, the second oxide material, and the third metal oxide material has a formula of MOx, wherein M is selected from Al, Ti, Mg, Zn, Ni, or combinations thereof, and x is a number satisfying the valence of M, and the first metal oxide material, the second oxide material, and the third metal oxide material are the same as or different from one another;

M-OH bonds are formed on a surface of the first bonding layer and a surface of the second bonding layer which face toward each other after the surface modification process; and the M-OH bonds polymerize to result in formation of M-O-M bonds and water molecules, the first bonding layer and the second bonding layer being bonded to each other through the M-O-M bonds.

11. The method according to claim 1, wherein formation of the first bonding layer includes:

forming a doped metal oxide layer on the device substrate to cover the semiconductor device, the doped metal oxide layer including a metal oxide matrix and the metal nanoparticles doped into the metal oxide matrix;

forming a first undoped metal oxide layer on the doped metal oxide layer opposite to the semiconductor device;

forming a second undoped metal oxide layer on the first undoped metal oxide layer opposite to the doped metal oxide layer; and subjecting the second undoped metal oxide layer to planarization, wherein the doped metal oxide layer and the first undoped metal oxide layer collectively serve as the first bonding sub-layer, and the second undoped metal oxide layer serves as the second bonding sub-layer.

12. The method according to claim 11, wherein each of the doped metal oxide layer, the first undoped metal oxide layer, and the second undoped metal oxide layer is formed by a deposition process conducted at a temperature ranging from room temperature to 300° C.

13. The method according to claim 11, wherein each of the metal oxide matrix and the first undoped metal oxide layer includes the first metal oxide material, and the second undoped metal oxide layer includes the second metal oxide material;

each of the first metal oxide material, the second oxide material, and the third metal oxide material has a formula of MOx, wherein M is selected from Al, Ti, Mg, Zn, Ni, or combinations thereof, and x is a number satisfying the valence of M, and the first metal oxide material, the second oxide material, and the third metal oxide material are the same as or different from one another;

M-OH bonds are formed on a surface of the first bonding layer and a surface of the second bonding layer which face toward each other after the surface modification process; and the M-OH bonds polymerize to result in formation of M-O-M bonds and water molecules, the first bonding layer and the second bonding layer being bonded to each other through the M-O-M bonds.

14. The method according to claim 1, wherein the metal nanoparticles include silver nanoparticles, gold nanoparticles, ruthenium nanoparticles, or combinations thereof.

15. A method for manufacturing a semiconductor structure, comprising:
- forming a first bonding layer on a device substrate formed with a semiconductor device so as to cover the semiconductor device, the first bonding layer including a first bonding sub-layer disposed on the device substrate and a second bonding sub-layer disposed on the first bonding sub-layer opposite to the semiconductor device, the first bonding sub-layer including a first metal oxide material in an amorphous state and a plurality of first metal nanoparticles, the second bonding sub-layer including a second metal oxide material in an amorphous state;
- forming a second bonding layer on a carrier substrate, the second bonding layer including a first bonding sub-layer disposed on the carrier substrate and a second bonding sub-layer disposed on the first bonding sub-layer of the second bonding layer opposite to the carrier substrate, the first bonding sub-layer of the second bonding layer including a third metal oxide material in an amorphous state and a plurality of second metal nanoparticles, the second bonding sub-layer of the second bonding layer including a fourth metal oxide material in an amorphous state;
- conducting a surface modification process on the first bonding layer and the second bonding layer;
- bonding the device substrate and the carrier substrate to each other through the first bonding layer and the second bonding layer; and
- annealing the first bonding layer and the second bonding layer so as to convert the first metal oxide material, the second metal oxide material, the third metal oxide material, and the fourth metal oxide material from the amorphous state to a crystalline state.

16. The method according to claim 15, wherein the surface modification process is conducted by a wet chemical process using an aqueous solution of a high temperature sulfuric peroxide mixture, an aqueous solution of a low temperature sulfuric peroxide mixture, deionized water, an aqueous solution of hydrogen peroxide, or combinations thereof.

17. The method according to claim 15, wherein the first bonding layer and the second bonding layer are annealed at a temperature ranging from 280° C. to 450° C.

18. A method for manufacturing a semiconductor structure, comprising:
- forming a first bonding layer on a first substrate formed with a semiconductor device so as to cover the semiconductor device, the first bonding layer including a first bonding sub-layer disposed on the first substrate and a second bonding sub-layer disposed on the first bonding sub-layer opposite to the semiconductor device, the first bonding sub-layer including a first metal oxide material in an amorphous state and a plurality of metal nanoparticles, the second bonding sub-layer including a second metal oxide material in an amorphous state;
- forming a second bonding layer on a second substrate, the second bonding layer including a third metal oxide material in an amorphous state;
- bonding the first substrate and the second substrate to each other through the first bonding layer and the second bonding layer; and
- annealing the first bonding layer and the second bonding layer so as to convert the first metal oxide material, the second metal oxide material, and the third metal oxide material from the amorphous state to a crystalline state.

19. The method according to claim 18, wherein the metal nanoparticles have a thermal conductivity ranging from 300 W/m-k to 450 W/m-k.

20. The method according to claim 18, wherein one of the first metal oxide material, the second metal oxide material, and the third metal oxide material in the crystalline state has a thermal conductivity ranging from 4 W/m-k to 22 W/m-k.

* * * * *